United States Patent
Horne et al.

(10) Patent No.: US 6,732,346 B2
(45) Date of Patent: May 4, 2004

(54) GENERATION OF ROUTE RULES

(75) Inventors: Stephen C. Horne, Austin, TX (US);
Gopal Vijayan, Austin, TX (US);
Donald W. Glowka, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 141 days.

(21) Appl. No.: 10/155,042

(22) Filed: May 24, 2002

(65) Prior Publication Data

US 2002/0178428 A1 Nov. 28, 2002

Related U.S. Application Data

(60) Provisional application No. 60/294,204, filed on May 25, 2001.

(51) Int. Cl.[7] ............................................... G06F 17/50
(52) U.S. Cl. ............................................. 716/12; 716/1
(58) Field of Search ................................ 716/1, 12–14

(56) References Cited

U.S. PATENT DOCUMENTS 6,011,912 A * 1/2000 Yui et al. ...................... 716/13
6,256,769 B1 * 7/2001 Tamarkin et al. ............. 716/12
6,577,145 B2 * 6/2003 Okuno et al. ................ 324/754

* cited by examiner

Primary Examiner—Stacy A. Whitmore
(74) Attorney, Agent, or Firm—Matthew J. Booth; Karen S. Wright

(57) ABSTRACT

This invention discloses a software tool 20 that generates wire route rules between logic gates in a semiconductor device for the automated layout of the logic gates in the device. The software tool 20 includes a routing rule generation tool 22 that creates a route rule database 30 for a given semiconductor fabrication technology and circuit family of logic gates, and includes a block build tool 32 that interconnects the logic gates with routes according to the route rules generated by the routing rule generation tool 22. The routing rule generation tool 22 further includes a noise sensitivity/gate characterization tool 24 and a rule generator tool 28. The block build tool 32 further includes a gate sizing tool 34, a gate analysis tool 36, a route rule selecting tool 38, a route assigning tool 42.

12 Claims, 10 Drawing Sheets

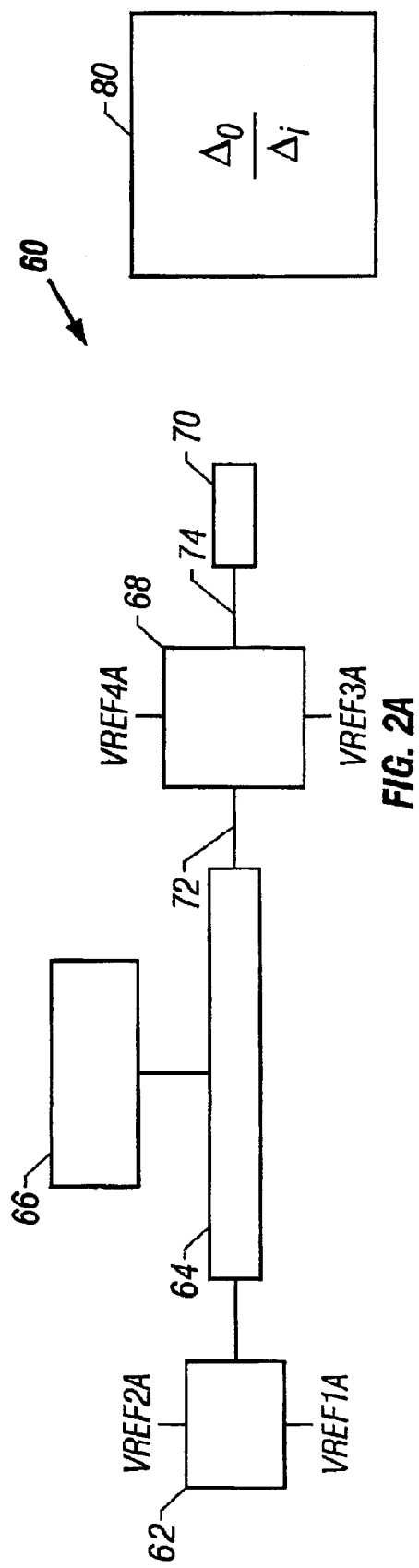
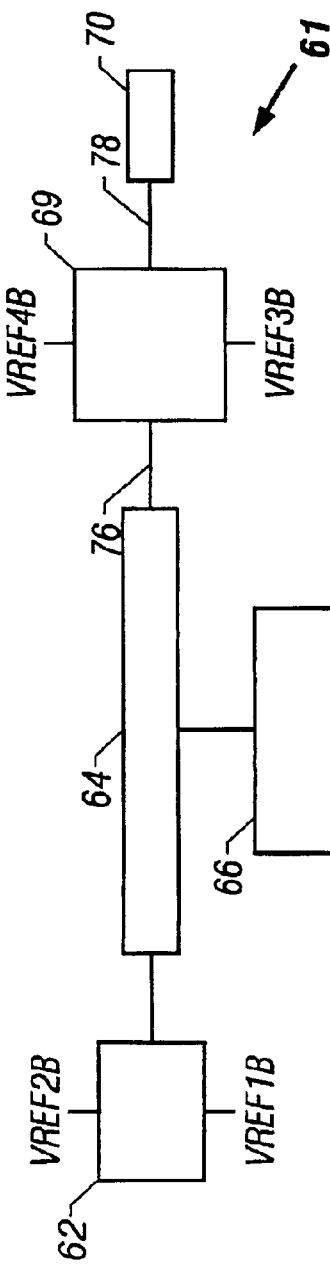
FIG. 2A
FIG. 2B

GENERATION OF ROUTE RULES

CROSS REFERENCE TO RELATED APPLICATIONS

This application claims the benefits of the earlier filed U.S. Provisional Application Serial No. 60/294,204, filed May 25, 2001(25.05.2001), which is incorporated by reference for all purposes into this specification.

BACKGROUND OF THE INVENTION

1. Field of the Invention

The present invention relates to the automated layout of semiconductor devices within an integrated circuit. More specifically, the present invention relates to the generation of route rules in the layout of semiconductor devices.

2. Description of the Related Art

The design of complex and high performance integrated circuits requires balancing the often conflicting requirements of robust circuits, high performing circuits, and reasonable design time and cost. The semiconductor design process is very complex and typically involves the use of numerous software tools that aid in the generation, simulation or analysis of the design. Even with the use of such tools, the design process of a complex integrated circuit may require hundreds of man-years of labor and considerable computation.

The design process may be thought of being divided into four main parts. The first part is logic design where the desired logic function is created. The next step is circuit design where the logic design is described at the transistor level, with the size of each transistor specified. The next step is designing the topographical configuration of the transistors and the associated interconnecting wires, which is known as the layout step. Lastly, the analysis (verification) step is where the expected electrical and physical properties of this topology are extracted from the design, and simulations are performed to verify that the circuit will operate at the desired speed, under the expected operating conditions, and will have acceptable reliability. Typically, problems are found in the analysis step that must be corrected in one or more of the preceding steps.

Broadly speaking, the methods used to perform logic design may be placed into one of two classes: synthesis and or custom design. Synthesized logic is described by the designer in some type of high level programming language, and then synthesized by a software tool into the logic gates needed to implement the desired logic function. Custom logic design, on the other hand, involves the designer designing or specifying the logic gates, perhaps down to the transistor level.

Circuit design methods differ and may be automated, partially automated, or manual. Generally, however, circuit design is the process of modifying logic gates (while retaining the same logical function) and specifying transistor sizes in those gates so that performance goals such as speed, power, area, and reliability are met. Since the design has not yet been described at a detailed geometrical or topographical level, the process of circuit design must involve estimates or predictions of the actual layout.

After layout, such things as wire lengths, widths, spacings, etc. can be extracted from the design. The design can be simulated with these "actual" parasitics and evaluated relative to the performance goals.

It is well known in the art that dynamic style CMOS circuit families can provide the highest performance in digital integrated circuits. Gates in these logic families are generally characterized by the use of a clocked precharge device to initialize a dynamic node in the logic gate and one or more transistors that conditionally discharge the dynamic node. To achieve the highest performance, the discharge or evaluation operation is made as fast as possible or practical so that logic operations can proceed at maximum frequency.

One type of dynamic logic, N-NARY logic or NDL, is better described in U.S. Pat. No. 6,069,497, which is incorporated by reference for all purposes into this disclosure. NDL uses 1 of N signals for conveying information between different NDL logic circuits. One of N signals are described in copending patent application, U.S. patent application Ser. No. 09/019,278, and also in U.S. Pat. No. 6,202,194, both of which are incorporated by reference for all purposes into this disclosure. And finally, NDL uses a logic synchronization technique that is better described in U.S. Pat. No. 6,118,304, which is also incorporated by reference for all purposes into this specification. All of the above patents and applications comprise FAST14 Technology and all are owned by Intrinsity, Inc., the assignee of this disclosure.

One of the hazards inherent in dynamic logic families is associated with a conditional discharge action. In order to make the discharge of the dynamic node as fast as possible, the precharge transistors are turned off during the evaluate phase. Keeper transistors are often present to prevent the dynamic node from losing charge due to parasitic leakage. However, such keeper transistors are made fairly weak so as to not impede the discharge action. The hazard that occurs is that the dynamic node is discharged inadvertently causing the gate to evaluate into an incorrect logic state.

There are several ways that charge can be lost from the dynamic node in dynamic logic family gates. The charge loss from these different mechanisms can be cumulative so that, even though one mechanism by itself may not be sufficient to discharge the gate, multiple charge loss mechanisms may act together to incorrectly discharge a gate. Furthermore, even if one isolated dynamic gate does not experience sufficient charge loss on its dynamic node to cause incorrect operation of that gate, a series of dynamic gates, each experiencing some partial charge loss, may interact in such a way that incorrect logical operation results.

One of the most important mechanisms of charge loss in dynamic gates is the presence of noise on the inputs to the logic gate. For example, if the dynamic node of a gate is precharged to a high voltage and conditionally discharged to a low voltage, the discharged transistors of the gate are typically n-channel transistors. If the inputs to the gate are all intended to remain low in a certain cycle, then the dynamic node is intended to remain high. If one or more inputs to the gate have noise so that their voltage level rises above the intended low voltage for a short time, the n-channel transistors may turn on enough to cause an incorrect discharge or partial discharge of the dynamic node.

Input signals to dynamic gates may experience noise from several unrelated sources. The main source of noise is from direct capacitive or inductive coupling by other signals. Another source of input noise is the partial discharge of a dynamic gate that generates the signal in question because the partial discharge results in the output voltage of the gate changing slightly (or greatly) from its intended value. Yet another source of noise is voltage supply differential among different dynamic gates. For example, a differential in the ground supply voltage between two gates can result in the output of the first gate, intended to be low, being perceived by the second gate as being at a voltage greater than the intended low voltage.

Another important mechanism for charge loss in dynamic gates is charge sharing within the evaluate or discharge circuit. For example, if the evaluate circuit is comprised of a network of n-channel transistors (often called the n-tree), then different nodes within the network of n-tree transistors may be at different voltages due to prior conditions in the gate. If a node that is at a relatively low voltage is coupled to the dynamic node, then the lower voltage node may partially discharge the dynamic node even if there is not a conducting path all the way to ground.

From the above discussion, we know that noise may be added to a circuit from within a gate, from the relationship between gates, or from the wiring that connects the gates together. Sufficient noise may be injected into the circuit at one point to cause failure. More difficult to analyze is the case where smaller amounts of noise are injected at several points in the circuit. Taken individually, each contribution of noise is not sufficient to cause failure. Taken together, however, the cumulative effect can result in failure.

Some or all of the previously discussed conditions may occur in a given gate under certain operating conditions. If the context and behavior of a gate is sufficiently known, these effects may be taken into consideration when designing the gate or routing its input or output wires. One problem for the design of complex integrated circuits is that it is extremely time consuming and expensive to analyze all gates at this depth due to the number and variety of circuits involved. Furthermore, the context of a single logic gate cannot be fully understood until the surrounding logic has been designed and laid out.

A common technique in the design process is to make simplifying assumptions about the context and operating conditions of a gate to expedite the process. To the extent that the actual noise conditions are not as severe as these simplifying assumptions assert, the design is over-constrained, leading to reduced operating speed, increased power, and increased circuit size. If the actual noise conditions are worse than assumed, then the circuit may fail to function as desired. Another common technique in the design process is to redesign parts or all of a logic circuit after an analysis of the circuit in its actual context reveals problems. The iterations of design, analysis, and redesign can be very expensive in manpower and time. Even by making simplifying assumptions and using automated design tools, the design and analysis of complex integrated circuits is sufficiently time consuming that the designer must often trade off making iterations in the design with schedule and accepting a lower quality design in the interest of reducing time to market.

The present invention provides an automated method for designing logic gates, particularly dynamic logic gates, and the logic gates' interconnect so that the circuits are immune to malfunction due to noise effects while retaining maximum circuit performance and minimizing the redesign of circuits due to discovery of noise problems. While the present invention is applicable to other logic families, the CMOS dynamic logic family or families benefit most from this invention because dynamic logic is well known in the art to be more noise-sensitive than static logic. One advantage of the present invention is that fewer iterations of design and analysis process are needed because the circuits are designed taking noise effects into consideration accurately. Another advantage of the present invention is that it is not excessively computation intensive, which allows designers to either reduce the design cycle time or to perform more iterations on a logic circuit's design.

SUMMARY OF THE INVENTION

This invention provides a software tool 20 that generates wire route rules between logic gates in a semiconductor device for the automated layout of the logic gates in the device. The software tool 20 includes a routing rule generation tool 22 that creates a route rule database 30 for a given semiconductor fabrication technology and circuit family of logic gates. Additionally, the software tool 20 includes a block build tool 32 that interconnects the logic gates with routes according to the route rules generated by the routing rule generation tool 22.

The routing rule generation tool 22 includes a noise sensitivity/gate characterization tool 24 that characterizes a suitable number of representative logic gates for noise sensitivity and determines the conditions under which an individual logic gate being characterized amplifies input noise with a certain gain. Additionally, the routing rule generation tool 22 includes a rule generator tool 28 that generates route rules that are derived using the representative logic gates using assumptions about internal charge sharing and supply voltage differences of said individual logic gate. The rule generator tool 28 uses an optimizing SPICE simulation for each sensing gate type, driving gate strength, sensing gate size, connecting route type, and charge sharing assumption to determine the required route length. And finally, the route rule database 30 stores information regarding the gate types and gate sensitivities of the representative logic gates.

The block build tool 32 interconnects the logic gates with routes so that the logic gates are immune to malfunction due to noise effects while retaining maximum circuit performance and minimizing the redesign of the semiconductor device due to the discovery of noise problems. The block build tool 32 includes a gate sizing tool 34 that sizes the individual gates using estimates for interconnect capacitance and resistance, a gate analysis tool 36 that compares the noise sensitivity for various receiving logic gates, a route rule selecting tool 38 that selects a route rule according to the most noise sensitive logic gate receiving the route, and a route assigning tool 42 that performs the application of route rules to the logic gates in the semiconductor design. The block build tool 32 repeats 46 the analysis, selecting, and assigning steps (using the appropriate tools 36, 38, and 42) until all signal routes have been assigned route rules 44. When all of the signal routes have been assigned route rules 48, the software tool the 20 passes the route database 30 on to other routing software 50 that will route the design according to the selected route rules.

DESCRIPTION OF THE DRAWINGS

To further aid in understanding the invention, the attached drawings help illustrate specific features of the invention and the following is a brief description of the attached drawings:

FIGS. 2A and 2B are block diagrams of simulated logic circuits.

DETAILED DESCRIPTION OF THE INVENTION

The present invention is a method and apparatus for the generation of route rules for the automated layout of semiconductor devices. This disclosure describes numerous specific details that include specific encodings, structures, circuits, and logic functions in order to provide a thorough understanding of the present invention. For example, the present invention describes circuits with dynamic logic and NDL logic gates. Additionally, the present invention describes the automated layout of semiconductor devices that use a number of software tools for the process. One skilled in the art will appreciate that one may practice the present invention without these specific details. Additionally, this disclosure does not describe some well known structures such as transistors, FETs, domino circuits, dynamic circuits, and software programming tools and languages in detail in order not to obscure the present invention.

Figure 1:
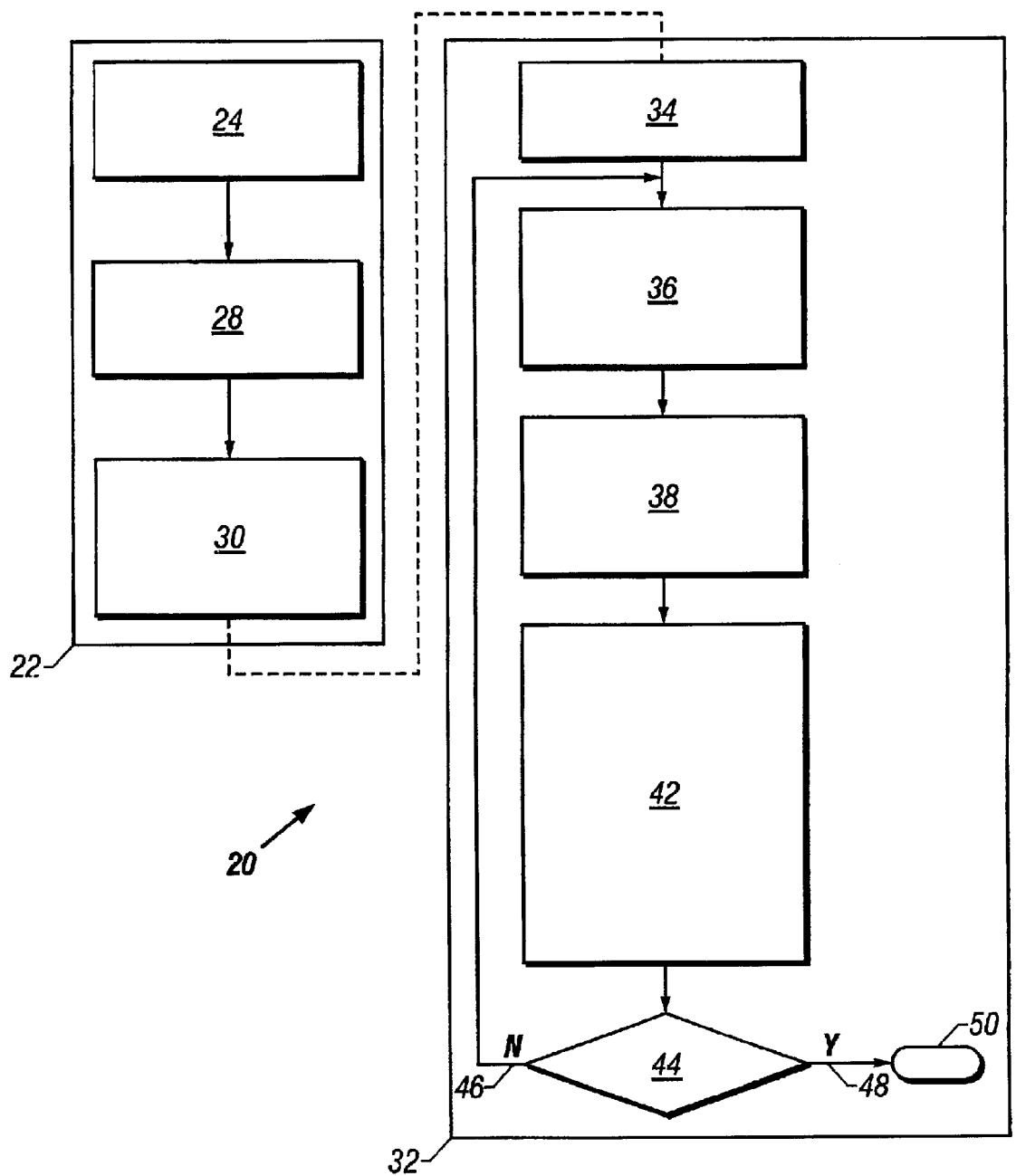
FIG. 1 is a block diagram of this invention.

FIG. 1 is a block diagram of a software tool 20 for the generation of route rules for the layout of semiconductor devices. A programmer can create the software tool 20 using any of a variety of high level software languages such as C or C++ that can operate on a variety of operating systems such as WINDOWS or LINUX. Each individual tool or sub-tool of the present invention can be created using the characteristics as defined and described in the this specification.

Figure 10:
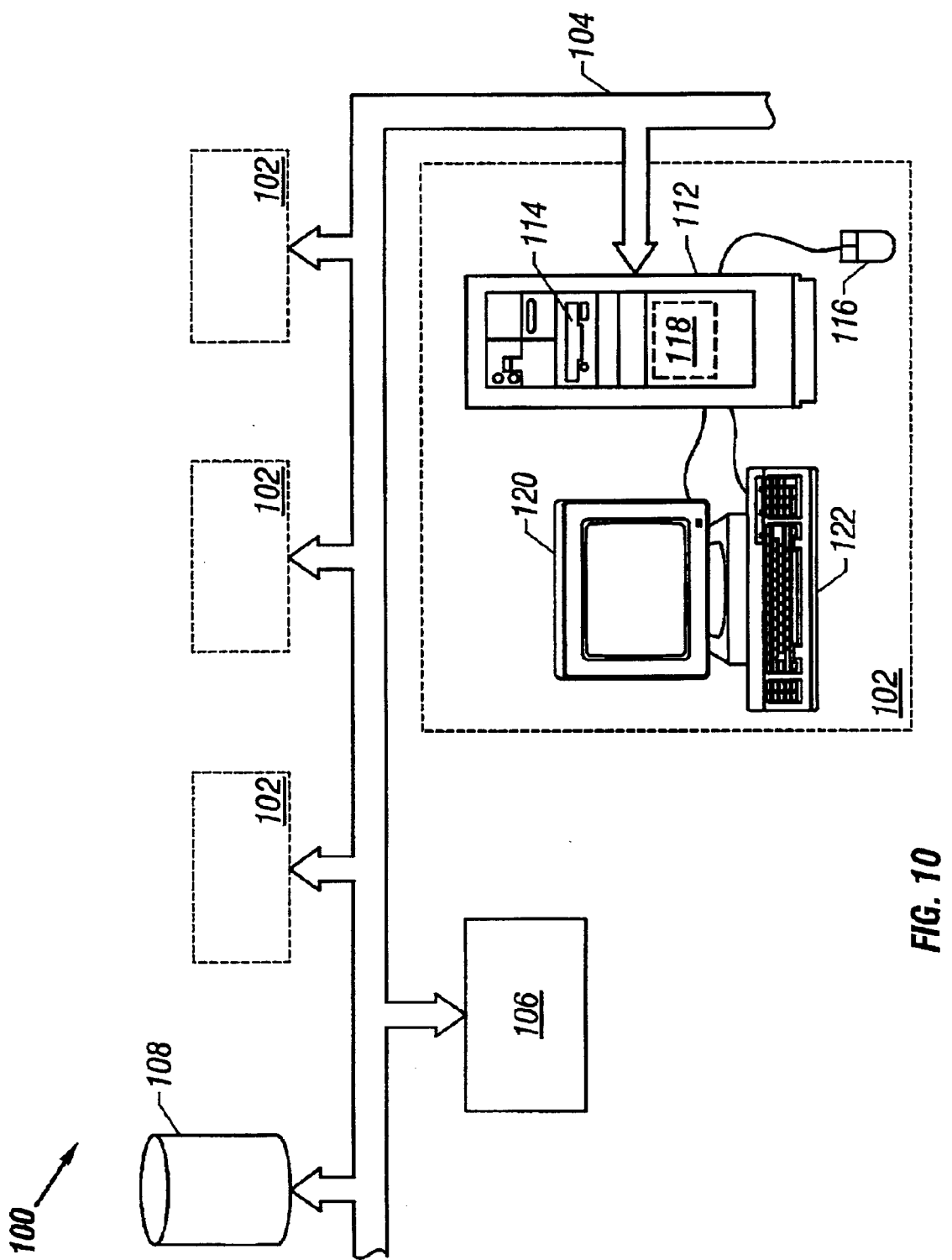
FIG. 10 shows a typical networked computer environment suitable for use with this invention.

The present invention 20 of FIG. 1 is preferably practiced in the context of a standalone or networked computer setup such as that illustrated in FIG. 10. In FIG. 10, a typical network 100 includes one or more computer workstations 102 networked together via a network connection 104, which is controlled by a network controller 106. The network 100 may also include various peripheral devices, such as a network storage device 108 and one or more printers (not shown in FIG. 10). A typical computer workstation 102 includes a computer 112, internal storage media such as RAM and or hard disks 118, external storage media such as a floppy disk and or a CD-ROM 114, and various interface devices such as a mouse 116, a monitor 120, and a keyboard 122.

The tool 20 comprises 2 main components: a routing rule generation tool or flow 22 and a block build tool or flow 32. The routing rule generation tool 22 comprises a number of sub-tools that first comprises a noise sensitivity characterization tool 24. The noise sensitivity or gate characterization tool 24 characterizes a suitable number of representative gates for noise sensitivity. If the design process or flow limits the designer to a relatively small selection of unique gates, then it is practical to characterize each type of logic gate. If, on the other hand, there are a very large number of unique gate structures and sizes in the design, then characterizing each gate for noise may not be practical. In this case, a smaller set of gates can be designed and characterized for noise sensitivity. The structure and sizing of these representative gates is quantified in such a way that the actual design gates' noise sensitivity can be correlated to the noise sensitivity of the representative gates.

The software tool 20 involves first characterizing the noise sensitivity of a number of representative gate designs. The noise sensitivity characterization results in rules that limit the amount of input noise at a specified logic gate. The logic gate designs used in this step are relatively few in number but represent the behavior of a large variety of actual design gates.

The noise sensitivity of a gate can be quantified in several ways. For example, the amount of output noise that a fixed amount of input noise causes can be measured by simulation. Alternatively, the amount of input noise required to cause a gate to malfunction can be determined by simulation. Tool 24 determines the conditions under which the gate being characterized amplifies input noise with a certain gain. This criteria is chosen so that successive stages of logic do not amplify the noise to greater and greater magnitudes. A logic gate is said to amplify input noise with greater than unity gain when an incremental increase in input noise voltage results in an incremental increase in output voltage that is greater than the input noise voltage increase. As long as the noise gain is less than unity at a gate, that gate is attenuating its input noise, preventing noise from increasing from gate to gate.

The next step in this invention is to determine the most sensitive logic gate input that is driven by a routed wire using tool 24. There are a number of ways to simulate and measure the noise amplification gain of a logic gate. Tool 24 uses a circuit simulator to simulate two identical circuits with slightly different levels of input noise. This tool compares the physical parameters (the best guess of this invention at this point in the design process) of the actual gate (the gate currently being built) to the representative gate's simulated parameters where the parameters.

FIGS. 2A and 2B are block diagrams of example simulated logic circuits as used in this invention. This invention performs the noise amplification gain characterization on each representative logic gate or on all the logic gates in the design as desired.

FIG. 2A illustrates a sample test circuit 60. Test circuit 60 comprises a driving gate 62 with voltage references from VREF2A to VREF1A. The driving gate 62 couples to an interconnect model circuit 64 that couples the driving gate 62 to a noise sensitive gate 68, which has voltage references (or power and ground connections) from VREF4A to VREF3A. The interconnect model circuit 64 also couples to an aggressor noise source circuit 66 using either inductive or capacitive coupling. And finally, a load circuit 70 couples to the noise sensitive gate 68. During the circuit simulation, the input noise 72 on the noise sensitive circuit 68 has a magnitude of X volts, and the output noise from circuit 68 has a magnitude of Y volts.

FIG. 2B illustrates a sample test circuit 61. Test circuit 61 comprises a driving gate 62 with voltage references from VREF2B to VREF1B. The driving gate 62 couples to an interconnect model circuit 64 that couples the driving gate 62 to a noise sensitive gate 69, which has voltage references (or power and ground connections) from VREF4B to VREF3B. The interconnect model circuit 64 also couples to an aggressor noise source circuit 66 using either inductive or capacitive coupling. And finally, a load circuit 70 couples to the noise sensitive gate 69. During the circuit simulation, the input noise 76 on the noise sensitive circuit 68 has a magnitude of $X+\Delta_i$ volts, and the output noise from circuit 78 has a magnitude of $Y+\Delta_0$ volts.

Tool 24 of this invention defines the noise gain 80 as the following:

$$\text{Noise gain} = \frac{\Delta_0}{\Delta_i} \qquad (1)$$

The simulation circuits 60 and 61 as illustrated in FIG. 2A and FIG. 2B are identical in their structure with both circuits including a driving gate, a noise sensitive gate, an interconnect model that connects the driving gate to the noise sensitive gate, and a load that is connected to the output of the noise sensitive gate. Noise is induced at the inputs of the noise sensitive gate 68 either from the aggressor noise source via the interconnect model, or by inducing a noise waveform on the power/ground connections of the driving gate relative to the power/ground connections on the noise sensitive gate. Noise is induced at the inputs of the noise sensitive gate 69 in the same manner as the noise sensitive gate 68 except that the noise magnitude at the noise sensitive gate 69 is caused to be slightly larger than that at the noise sensitive gate 68. The output voltage of each gate is measured during the simulation and the amount of noise measured on each output is noted. The difference of the two output voltages divided by the difference of the two input voltages is the noise gain 80.

During the simulation of a semiconductor device in this invention, a number of simulations are performed with different amounts of input noise until the amount of input noise that results in a predetermined amount of gain is found. Various other measurements are taken from the simulation when the circuit is operating at the desired gain point. For a dynamic gate, the most important measurement is dynamic node voltage loss, though peak input noise voltage and peak output noise voltage are also important. The dynamic node voltage loss is a useful measurement to make because charge sharing is a relatively independent mechanism that can also generate dynamic node voltage loss. For various logic gates, the dynamic node voltage loss may be allocated in varying proportions to input noise effects and charge sharing effects.

An alternative embodiment of the measurement of noise gain may also be accomplished with a single circuit, simulating a number of times with a different amount of input noise in each simulation. The first derivative of the output noise versus input noise curve yields the appropriate noise gain.

Figure 3:
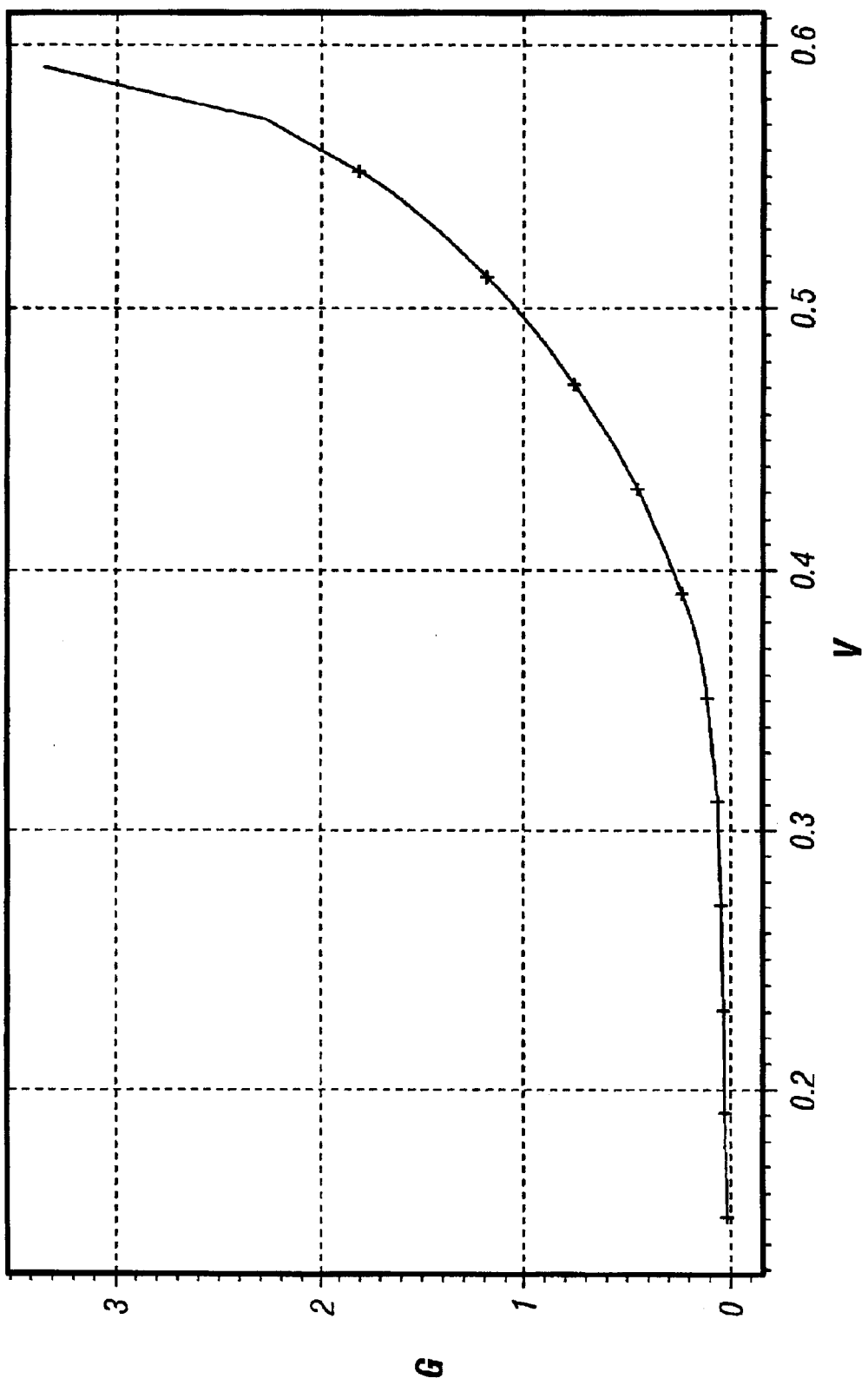
FIG. 3 illustrates the noise gain versus the input voltage value for a simulated logic gate.

FIG. 3 illustrates the small signal noise gain (G) versus the peak input noise voltage value ($V_I$) for a logic gate simulated according to this invention. This figure shows that at a peak input noise voltage of 0.5V, the measured noise gain is about one. Therefore, for input noise values greater than 0.5V, the incremental addition of input noise is amplified by the logic gate. For input noise values less than 0.5V, incremental addition of input noise is attenuated by the logic gate.

Figure 4:
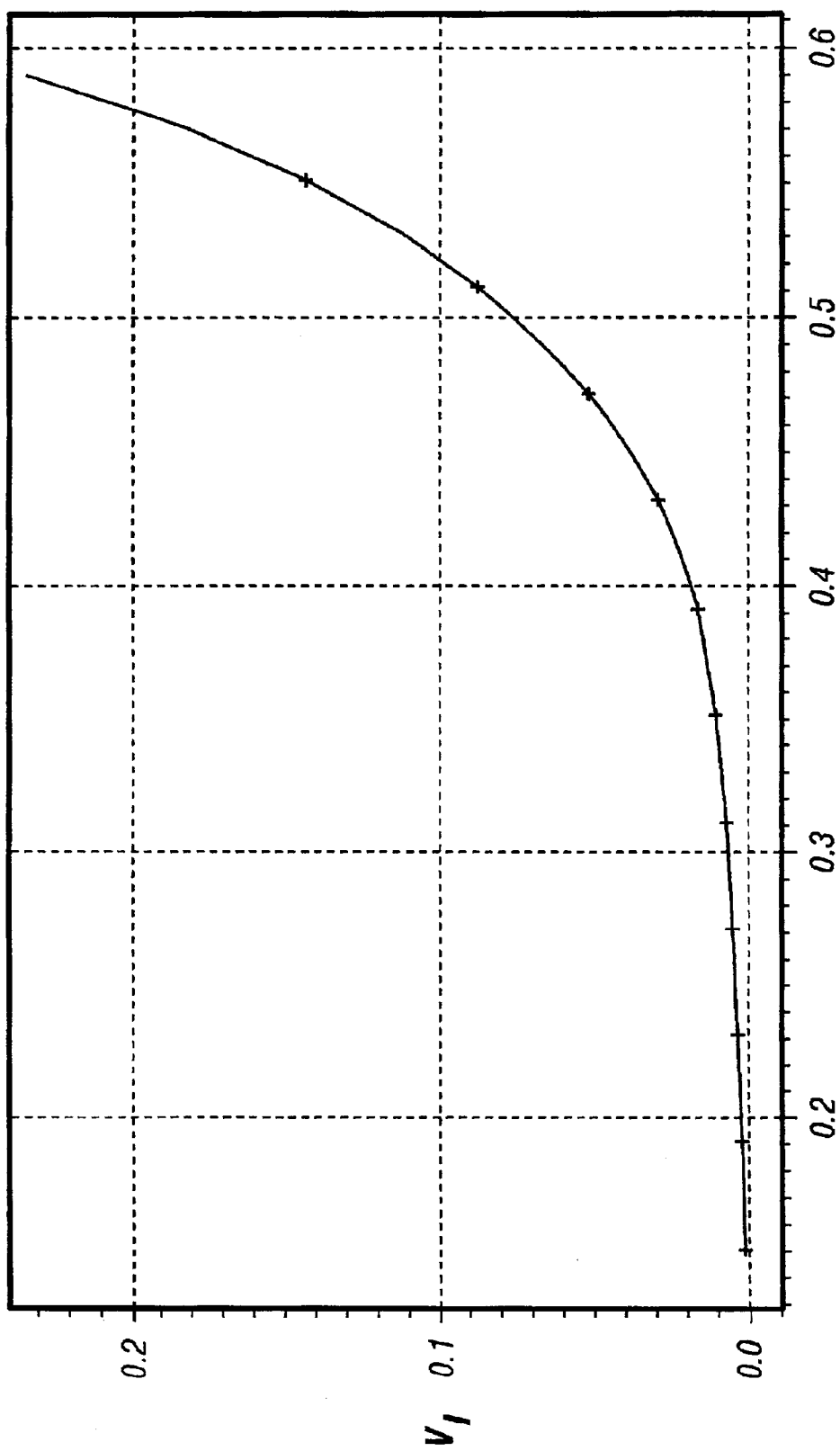
FIG. 4 illustrates the peak output noise versus the peak input noise for a simulated logic gate.

FIG. 4 illustrates the peak output noise ($V_O$) varying as a function of the peak input noise ($V_I$) for the same simulated logic gate. At the unity gain point (0.5V), the output noise voltage is much less than the input noise voltage (0.07V versus 0.5V). At this point, the absolute value of noise is being attenuated by the gate. However, an incremental increase in noise is being amplified. This is important because, in addition to the noise amplification that can take place within a gate, noise can be added via the interconnect between the gates. The noise on the output of a gate may be increased by the interconnect coupling on that output.

Figure 5:
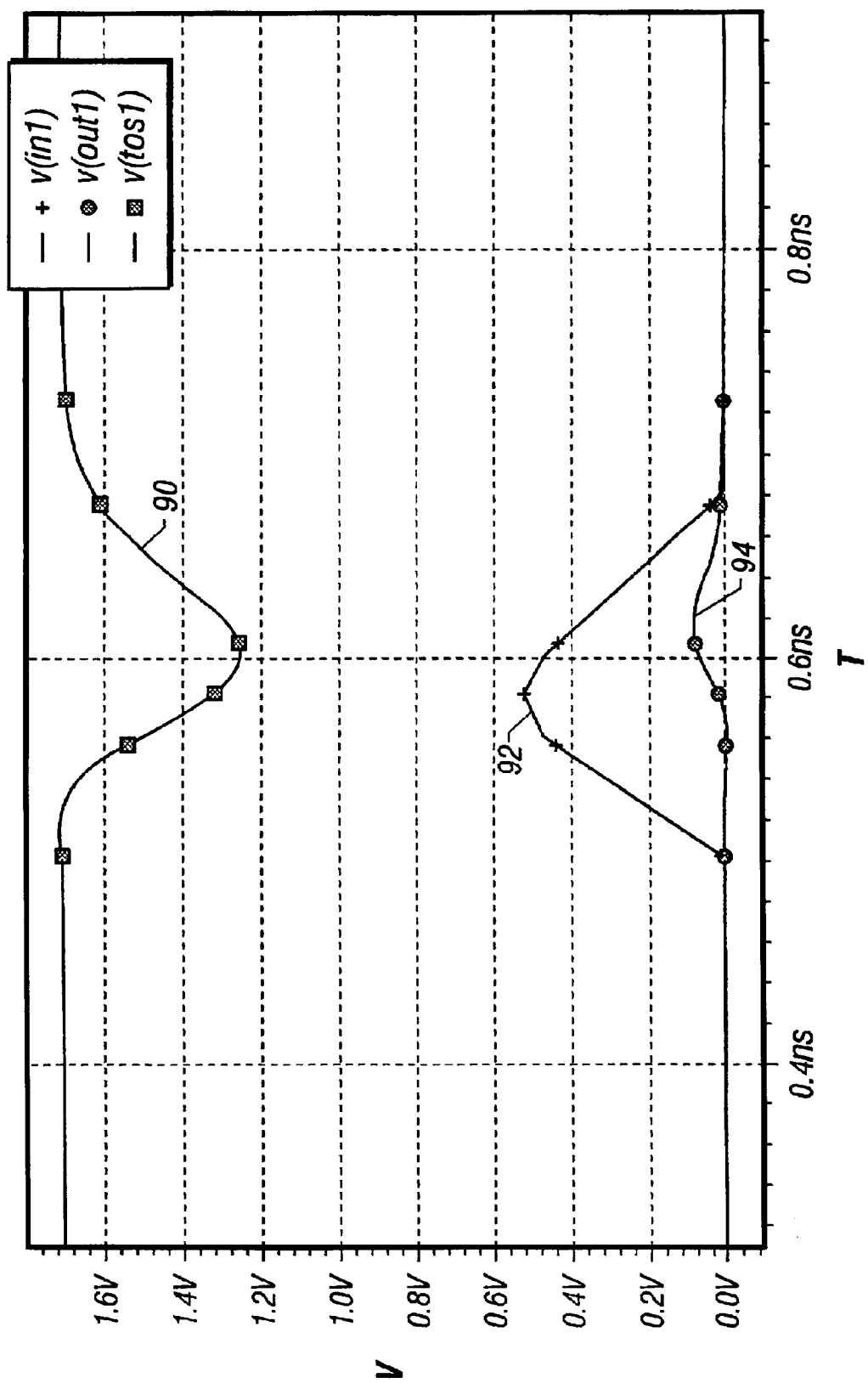
FIG. 5 illustrates the voltage versus time for a simulated logic gate.

FIG. 5 illustrates the voltage (V) versus time (T) from the same simulated logic gate with the peak input noise at 0.51V. This figure shows that the dynamic node inside the logic gate 90 loses charge in response to the input noise 92 (to the gate), dropping to a minimum of about 1.23V. In response to the dynamic node voltage loss, the output of the gate 94 rises to about 0.07V. The noise gain target chosen for this characterization process depends on the design goals, the uncertainty in various design input data and the extent to which the design can decrease operating margin to increase performance. Typically, a noise gain target of unity is a good choice because it is unlikely that all of the assumptions leading to this level of noise on a number of sequential gates will be met at the same time. Thus, a certain amount of operating margin is designed into the circuit.

Figure 6A:
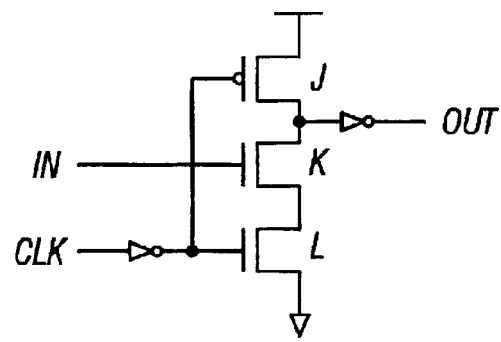
FIGS. 6A, 6B, and 6C are examples of logic gates that do not have charge sharing issues.
Figure 6B:
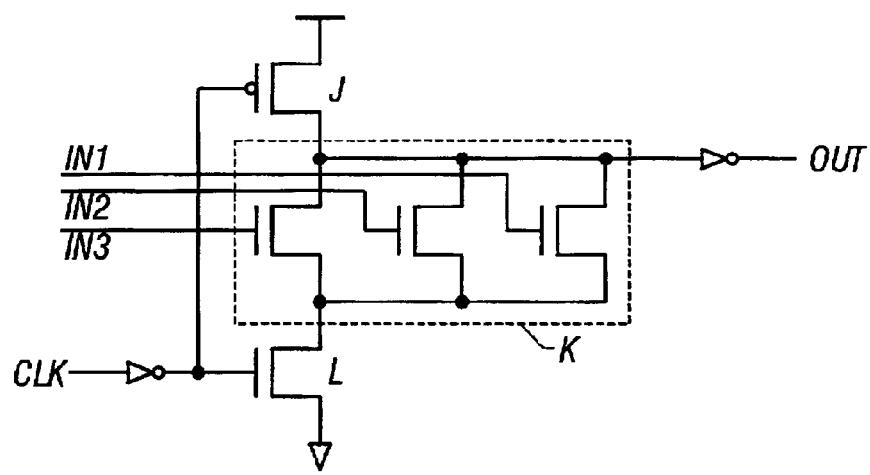
Figure 6C:
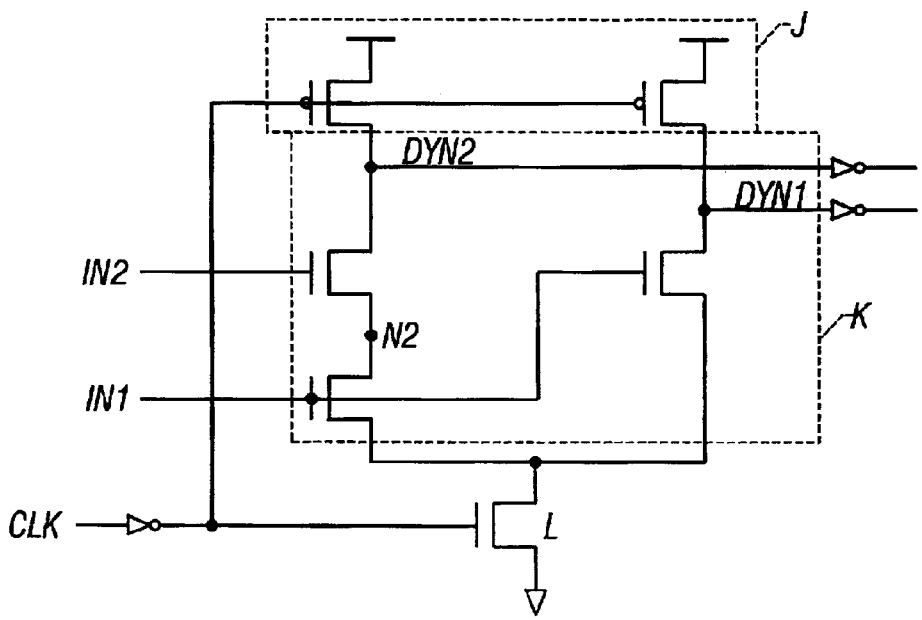

Another function of tool 24 is to determine whether charge sharing can occur in the logic gate, and if so, how much charge sharing is possible. This step is required because charge sharing is a source of noise that is somewhat unrelated to input noise. Although charge sharing in dynamic logic gates is possible, there are number of different layout techniques for dynamic logic gates to eliminate charge sharing. These techniques are recognizable by their physical layout structure. To better illustrate these layout techniques, FIGS. 6A, 6B, and 6C show examples of logic gates that do not have charge sharing issues. FIGS. 6A, 6B, and 6C each comprise a dynamic logic gate with a precharge device (J), an N-Tree (K), and an evaluate device (L).

Referring to FIGS. 6A and 6B, if any of the inputs go high during the evaluate phase, the dynamic node will be pulled low, so there is no charge sharing hazard with these inputs. If all the inputs stay low, there is also no charge sharing hazard. In the case of FIG. 6C, there is a charge sharing hazard associated with dynamic node DYN2, but not with dynamic node DYN1. As will be seen below, this can allow the route rule for input IN1 to be relaxed relative to input IN2.

If the invention determines that charge sharing is possible from the inspection of the logic gate, then the invention will determine the amount of charge sharing. There are several methods to determine charge sharing. One method is to simulate the charge sharing event. A simpler method is to calculate the voltage loss according to the estimated capacitances at each node in the circuit. For example, in FIG. 6C, if the capacitance of node DYN2 is CDYN2 and the capacitance of node N2 is CN2, then the amount of voltage lost during a charge sharing event is estimated to be VDD*(1−CDYN2/(CN2+CDYN2)).

In the present invention, the degree to which charge sharing may occur is limited by the addition of transistors in the N-tree that precharge the intermediate N-tree nodes to a certain voltage level. The transistors inserted into the N-tree for this purpose are referred to as "internal precharge transistors" to differentiate them from the precharge transistors at the top of the N-tree. The maximum amount of voltage loss that is possible given the algorithm for internal precharge insertion is determined by simulating representative gate designs. This degree of voltage loss is then used as the voltage loss seen in gates that, due to their structure, are determined to be susceptible to charge sharing.

It is apparent that whether or not charge sharing occurs and how much charge sharing occurs will vary according to the particular dynamic node of concern within a gate and according to the state of the inputs of the gate. Depending on that level of complexity that is acceptable in the noise analysis flow, these factors may be taken into account. If, in the interest of flow development or analysis time, it is desired to reduce the complexity of the flow, simplifying assumptions may be made to conservatively estimate the amount of charge sharing. It is clear that various degrees of simplification are possible in this regard within the scope of the invention. It is also noted that more complex charge sharing analysis to more precisely determine the voltage loss due to this effect is possible within the scope of this invention.

The routing rule generator tool 22 uses a rule generator tool 28 to generate route rules that are derived using these representative gates using assumptions about internal charge sharing and supply voltage differential. Route rules dictate to the router software (or human layout designer) the wiring style to use to connect certain gates. These route rules are generated using circuit simulation and are designed to limit the input noise to a gate to a safe value. Since the rules are specific to the various representative gates, the routing rules can be made more lenient for noise-tolerant gates while more restrictive for noise-sensitive gates.

The next step in the rule generation rule 28 is to select a route rule corresponding to the worst case noise sensitivity characterization and the charge sharing characterization previously performed and assign a route rule to the wire and store the route rule in route rule database 30. A route rule specifies the maximum distance a wire may be routed. Route rules are needed in this invention for various cases of connections that include the following control variables: (1) type of interconnect (level of metal layer); (2) route type (random, bundled, twizzled or rotated); (3) wire space; (4) wire width; (5) fraction of the load that is a gate load; and (6) sensing gate input characteristics.

The sensing gate input noise sensitivity characteristics vary with the gate structure, with the particular input under consideration, the transistor sizes of the gate, and with the possible effect of charge sharing. Additionally, for complex dynamic gates, one input may affect more than one dynamic (top of stack) node, and may have differing noise characteristics depending on the top of stack node being considered.

For each case defined by the above variables, and for various route widths and spaces, a simulation is performed to determine the maximum allowed route length. In this invention, the simulation is performed as an optimizing simulation where the simulator varies the simulated interconnect length until the desired dynamic node voltage loss is achieved. The resulting interconnect length then represents the longest route permitted for that combination of control variables.

Figure 7:
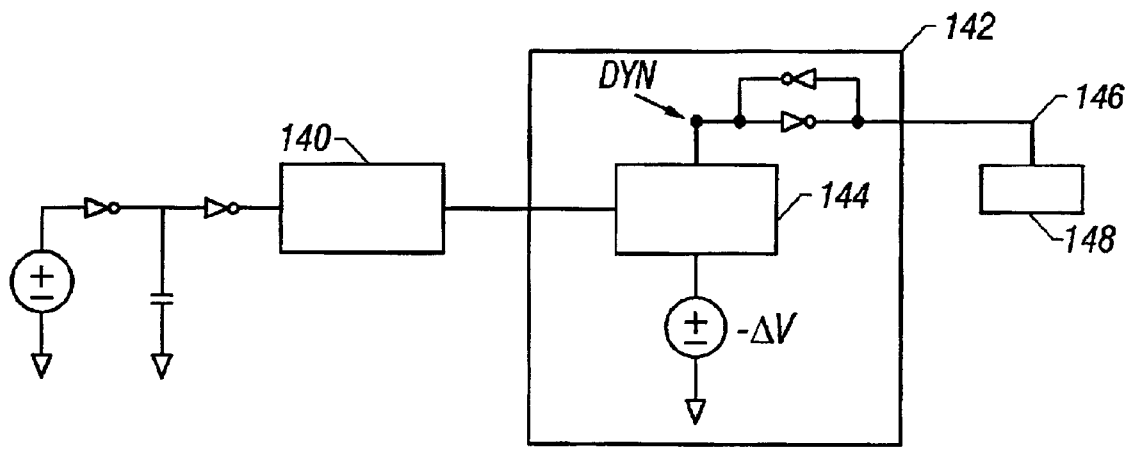
FIG. 7 is a schematic of an example interconnect logic circuit used in this invention.

FIG. 7 is a schematic of an example interconnect logic circuit used in this invention in an optimizing simulation. The example interconnect logic circuit includes a coupling circuit 140 coupled to a sensing gate 142. The sensing gate 142 further includes an N-tree 144 with dynamic node DYN. Additionally, the sensing gate 142 couples to a load 148 via output 146. The interconnect circuit of FIG. 7 models the resistance and capacitance and possibly the inductance of the victim route (the route that connects the driving gate to the sensing or receiving gate). The interconnect circuit also models the coupling (either inductive, capacitive, or both) that couples an aggressor waveform onto the victim route. The interconnect model will model one of several possible route geometries. The possible route geometries depend on the routing tool and the design style. This invention includes and models the following route geometries: (1) random; (2) bundled; and (3) bundled and twizzled In the random route case, the location of the aggressor driver relative to the sensing gate is assumed to not be known. The worst case scenario is that the aggressor driver is located close to the sensing gate and that much of the victim route length is being coupled to by aggressors with similar waveforms.

In the bundled route case, it is known that the aggressor driver(s) are located close to the victim driver and that the victim route has no other neighbors besides these associated aggressor routes.

The twizzled or rotated case is similar to the bundled case except that the bundled routes are scrambled or twizzled part way through the route so that two particular routes are only neighbors for half the route distance. TWIZZLING is better described in more detail in U.S. Pat. Nos. 6,202,194 and 6,211,456, both of which are incorporated by reference for all purposes into this disclosure. Both patents are part of FAST14 Technology, which is owned by Intrinsity, Inc., the assignee of this disclosure.

Figure 8A:
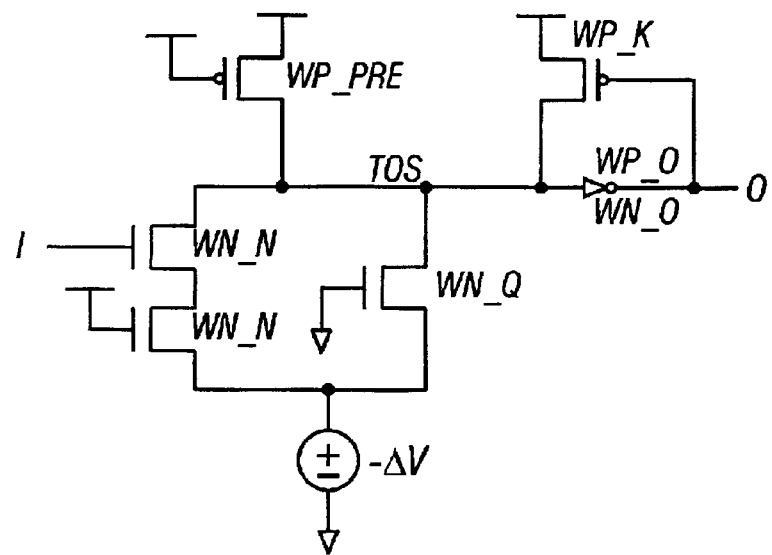
FIGS. 8A, 8B, and 8C illustrate different sensing gates used by this invention.
Figure 8B:
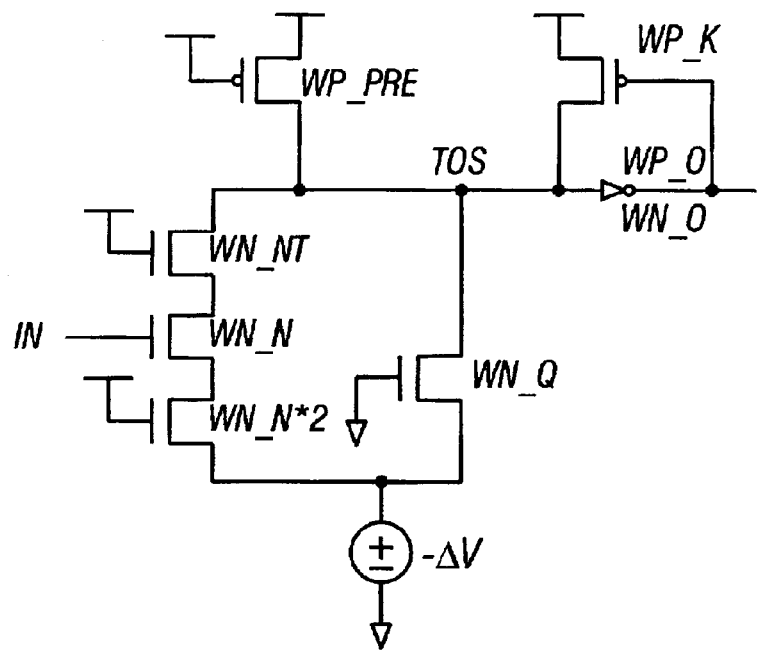
Figure 8C:
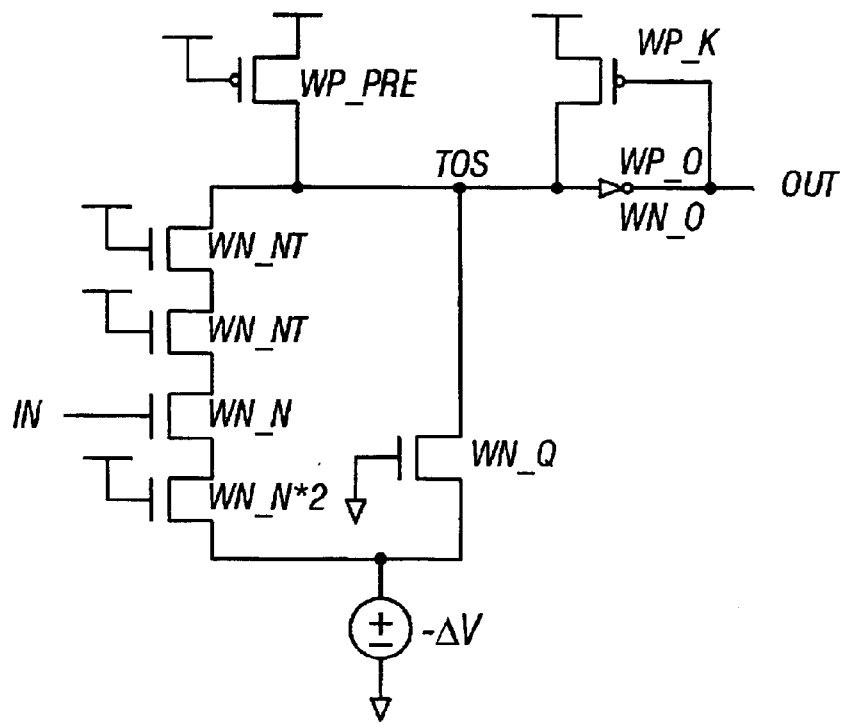

FIGS. 8A, 8B, and 8C illustrate different sensing gates used in this optimizing simulation. The 3 sensing gates all have an output inverter with size WP_O/WN_O (describing the p and n width of the inverter, respectively). They also have a keeper transistor (width WP_K), a precharge transistor (width WP_PRE), a quiet n transistor (width WN_Q) and a noisy transistor (width WN_N). The noisy transistor is driven by the input to the sensing gate. Additionally, the noisy transistor of each sensing gate has noise induced on it by a coupling circuit such as the circuit illustrated in FIG. 7.

The gate in FIG. 8A has an input driving a transistor gate at the top of the N-tree stack. The gate in FIG. 8B has an input driving the gate of a transistor one level down from the top level in the stack. And, the gate in FIG. 8C has an input driving the gate of a transistor that is two levels down from the top of the stack. For similar transistor sizes, the gate in FIG. 8A is more noise sensitive than the gate in FIG. 8B. Likewise, the gate in FIG. 8B is more noise sensitive than the gate in FIG. 8C. There is greater noise sensitivity if the noisy transistor is closer to the top of the stack (TOS) because there is less capacitance for the transistor to discharge. Additionally, the keeper transistor is more able to keep the TOS node at a high level if there are series transistors between the noisy transistor and the top of stack. The supply connected between GND and the N-tree is set to a small negative voltage to model the differential supply voltage difference between a driving gate GND and a sensing gate GND. A negative GND differential like this makes the receiving gate more noise sensitive because the perceived input voltages are higher.

The noise sensitivity of the gates in FIGS. 8A–8C is changed by adjusting the various transistor sizes. In these gates, if the p:n ratio of the output inverter is held constant, the noisy transistor width (WN_N) together with the ratio of WN_N over the TOS node capacitance are a good predictor of the noise sensitivity of the gate. For this reason, a "noisy width ratio" (NWR) is defined to be NWR=WN_N/(WP_O+WN_O+A*WN_Q+B*WP_PRE), where A and B are constants that reflect the per unit width capacitance of NFET and PFET drains, respectively, relative to the output inverter gate capacitance. There are 2 or 3 values for WN_N and about 5 values of NWR for each WN_N that will allow the entire range of gate sizes used in the actual design to be represented in terms of noise sensitivity. The three styles of gates (8A, 8B, 8C) represent the different levels that an input signal may drive the N-tree.

For each sensing gate type, driving gate strength, sensing gate size, connecting route type, and charge sharing assumption, an optimizing SPICE simulation is performed to determine the route length required to result in a top-of-stack voltage loss corresponding to the unity noise gain operating point determined with tool 24. The optimizing SPICE simulation varies the route length until the top-of-stack voltage loss is equal to the goal. This is the maximum route length that is possible for that gate and route configuration without exceeding the noise gain target.

For all route styles, longer routes are more noise prone because the victim driver has less control over the far end of the route due to the route impedance. Thus, routes that are shorter than the maximum route length found above are less noisy than the criteria established for that gate and input type.

Charge sharing assumptions are taken into account in this optimizing SPICE simulation by initializing the top-of-stack node voltage to $V_{DD}-V_{CS}$, where $V_{CS}$ is the amount of voltage loss due to charge sharing. This has the effect of reducing the amount of allowable input noise (and therefore the length of the victim route) because less noise is required to reduce the top-of-stack voltage to the value that corresponds to the unity noise gain operating point.

The foregoing steps result in a set of maximum allowed route lengths for various route configurations, gate types, input position within the gate and gate size characteristics. These route rules are recorded and used during the actual design optimization, construction and routing process, as described in the block build tool 32.

The routing rule generator tool 22 uses the information from the previous steps to build a route rule database 30 for various receiving gate types and gate sensitivities. One advantage of this invention is that the routing rule generation flow to create the route rule database only needs to be performed once for a given IC fabrication technology and circuit family of gates. In other words, for each particular manufacturing process that may be used in building a design, one needs to build a database of representative gates and route rules where there is information about each representative gate's noise sensitivity.

The next part of this invention is a block build tool or block build flow 32. Unlike the routing rule generation flow 22, this part of the invention is executed one or more times (in an iterative process) during the normal design, layout, and analysis flow of designing a semiconductor device.

The first part of the block build flow 32 is the sizing of the transistors by a gate sizing tool 34. During the course of the actual circuit design, the transistors in the design are sized using estimates for interconnect capacitance and resistance. When a gate has been sized, its structure, input signal identity and transistor sizes are evaluated to determine the gate's noise sensitivity.

The next step of the block build flow 32 is to assign a route rule to each wire that connects two or more gates together. A gate analysis tool 36 first analyzes the logic gates, then the most appropriate routes are selected by a route rule selecting tool 38. The route rule scan tool 38 scans each wire that connects two or more gates in the design. A wire is typically driven by one gate and received by one or more gates. To determine a route rule, the receiving gates' noise sensitivity are compared by the gate analysis tool 36 and the route rule is selected to according to the most noise sensitive gate receiving the route by the route rule scan tool 38. The route length and other characteristics are used to select the appropriate route rule as well. In this way, more compact but noise-prone routes are used to drive gates that are relatively noise-tolerant while more costly but less noisy routes are used to drive gates that are sensitive to noise. Since the route rule is selected according to the requirements of the driving and receiving gates and the distance between them, the design is more optimum than if the route rule were chosen by a more simple and conservative set of criteria.

The process of optimizing a digital logic design includes the sizing of the transistors that make up each gate in such a way that design goals such as performance or power consumption are achieved. Gate construction is the step of creating the layout of the gate's transistors. The next step in the process is the routing of the design, which is the point at which the route rules are applied. In this invention, the route rule select and assign tool 42 performs the application of the route rules to the design.

After a certain gate is sized, its structure and size is analyzed by tool 36. This analysis is performed for each input to the gate, and for each top-of-stack (TOS) node controlled by that input.

For each input-TOS pair, the noisy transistor width (WN_N) is determined as follows by tool 36. The transistors whose gates are driven by the input are considered to be "noisy". That is, their gate voltage is assumed to be nominally low but has some amount of noise present. The transistors above and below the noisy transistors are assumed to be enabled so that the input noise has the potential of incorrectly discharging the TOS node. There may be other transistors in parallel with the noisy input transistors. (This is discussed in more detail below for FIG. 9).

Depending on the identity of the input signal driving these parallel transistors, those transistors may be known to be not noisy, known to be noisy, or not known to be either noisy or not noisy. If they are known to be not noisy, their width is not added to the noisy width WN_N. If they are known to be noisy, or if their noise characteristics are not known, their width is added to the noisy width WN_N. In this way, the cumulative width of the maximum number of parallel noisy transistors associated with the noisy input is recorded. These transistors are at a certain level in the stack (relative to the top of stack position). Additionally, the capacitive load at the TOS node is computed. Since the noise sensitivity of the gate is characterized by the input level in the stack, by the noisy width WN_N, and by the noisy width ratio NWR, the noise sensitivity of this input-TOS pair is known. Sometimes, an input is associated with more than one TOS node. In this case, the noisy width is computed separately for each TOS node. Thus, an input may have several noisy widths and levels in the stack that are associated with different TOS nodes.

Figure 9:
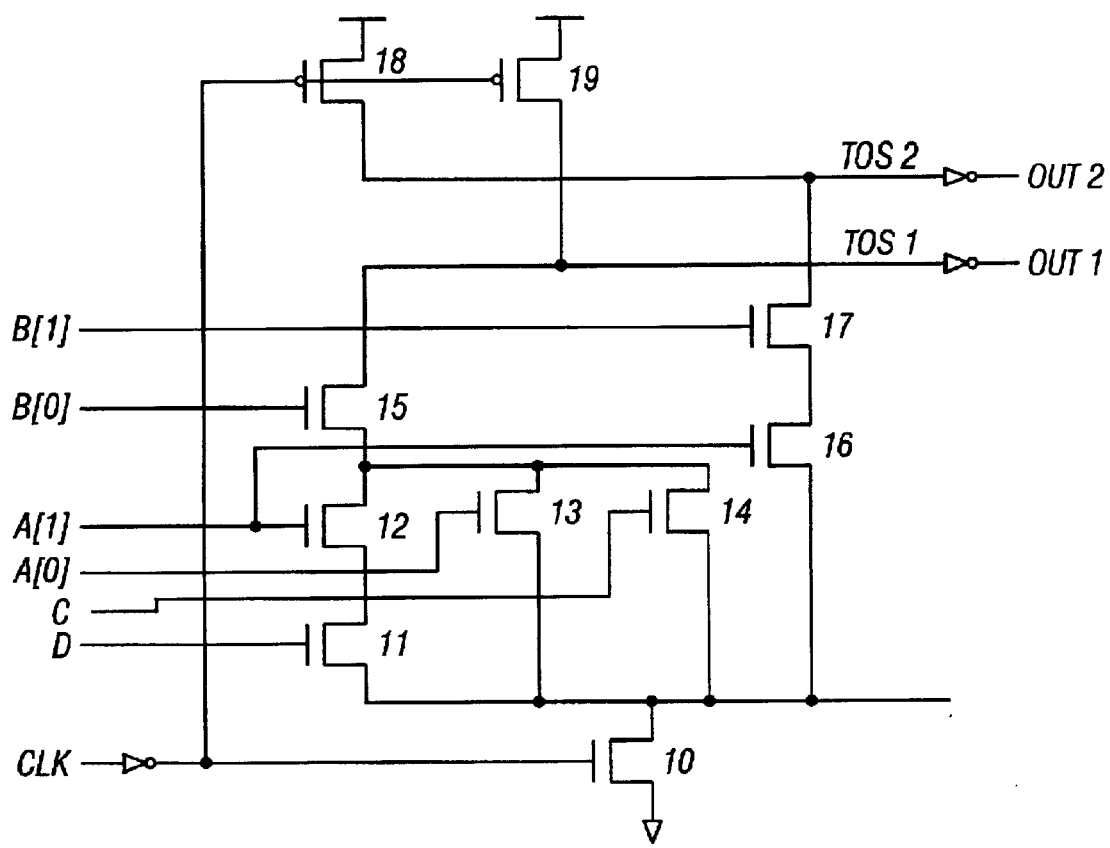
FIG. 9 is a schematic of an example logic gate simulated using this invention.

FIG. 9 is a schematic of an example logic gate simulated with tool 36. The example logic gate includes an input A[1] drives transistors 12 and 16. Transistor 12 is part of a path that discharges node TOS1 and transistor 16 is part of a path that discharges node TOS2. Thus, there are two input-TOS pairs to consider for A[1]:A[1]/TOS1 and A[1]/TOS2.

In order to sensitize the first path for the noise problem with tool 36, transistors 15 and 11 are assumed to be turned on and transistors 12, 13, and 14 are assumed to be off. Noise on the gate of transistor 12 creates the noise hazard under analysis. If input A[0] is known to not have noise when input A[1] has noise, then the width of transistor 13 (W13) is not considered noisy width. If input C is known to potentially have noise when input A[0] has noise, then the width of transistor 14 (W14) is added to the width of transistor 12 (W12) to compute WN_N: WN_N=W12+W14. For the path that discharges TOS2, input B[1] is assumed to be on to sensitize a noise hazard on transistor 16. WN_N in this case is simply W16 since no other transistor can act with transistor 16 to incorrectly discharge TOS2.

The input noise sensitivity so determined is used to select a route rule with tool 38 in the following manner. A signal route is driven by one gate but may be received by more than one gate. The noise sensitivity of the inputs of each receiving gate is determined as described above. The most noise sensitive input determines the route rule since the other inputs are more tolerant of noise. The noisy width WN_N, the noisy width ratio NWR, and the level in the stack of that input are used to look up the maximum route length permitted by the route rules for the various route types. The least restrictive route rule that permits the desired length route is selected as the route rule for that signal route. For example, if several bundle routes of different spaces can be routed safely for the desired length, the route rule with the smallest space may be selected so that the route occupies the least area. As another example, if a randomly routed route and a bundle routed route both meet the route length requirements, the random route type may be selected since it imposes fewer restrictions than a bundled route.

The selected route rule information is stored in association with the signal route name using the route assigning tool 42 that assigns a route to a particular net. Tool 32 repeats 46 the analysis, selecting, and assigning steps (using the appropriate tools 36, 38, and 42) until all signal routes have been assigned route rules 44. When all of the signal routes have been assigned route rules 48, the software tool 20 then passes the route database 30 on to other routing software 50 that will route the design according to the selected route rules.

To summarize, this invention provides a software tool 20 that generates wire route rules between logic gates in a semiconductor device for the automated layout of the logic gates in the device. The software tool 20 includes a routing rule generation tool 22 that creates a route rule database 30 for a given semiconductor fabrication technology and circuit family of logic gates. Additionally, the software tool 20 includes a block build tool 32 that interconnects the logic gates with routes according to the route rules generated by the routing rule generation tool 22.

The routing rule generation tool 22 includes a noise sensitivity/gate characterization tool 24 that characterizes a suitable number of representative logic gates for noise sensitivity and determines the conditions under which an individual logic gate being characterized amplifies input noise with a certain gain. Additionally, the routing rule generation tool 22 includes a rule generator tool 28 that generates route rules that are derived using the representative logic gates using assumptions about internal charge sharing and supply voltage differences of said individual logic gate. The rule generator tool 28 uses an optimizing SPICE simulation for each sensing gate type, driving gate strength, sensing gate size, connecting route type, and charge sharing assumption to determine the required route length. And finally, the route rule database 30 stores information regarding the gate types and gate sensitivities of the representative logic gates.

The block build tool 32 interconnects the logic gates with routes so that the logic gates are immune to malfunction due to noise effects while retaining maximum circuit performance and minimizing the redesign of the semiconductor device due to the discovery of noise problems. The block build tool 32 includes a gate sizing tool 34 that sizes the individual gates using estimates for interconnect capacitance and resistance, a gate analysis tool 36 that compares the noise sensitivity for various receiving logic gates, a route rule selecting tool 38 that selects a route rule according to the most noise sensitive logic gate receiving the route, and a route assigning tool 42 that performs the application of route rules to the logic gates in the semiconductor design. The block build tool 32 repeats 46 the analysis, selecting, and assigning steps (using the appropriate tools 36, 38, and 42) until all signal routes have been assigned route rules 44. When all of the signal routes have been assigned route rules 48, the software tool the 20 passes the route database 30 on to other routing software 50 that will route the design according to the selected route rules.

Other embodiments of the invention will be apparent to those skilled in the art after considering this specification or practicing the disclosed invention. The specification and examples above are exemplary only, with the true scope of the invention being indicated by the following claims.

We claim the following invention:

1. A software tool that generates wire route rules between logic gates in a semiconductor device for the automated layout of the logic gates in the device, comprising:

a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate; and said route rule database that stores information regarding the gate types and gate sensitivities of said representative logic gates;

a block build tool that interconnects said logic gates with routes according to the route rules generated by said routing rule generation tool, said block build tool further comprises:

a gate sizing tool that sizes said individual gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

2. A system that generates wire route rules between logic gates in a semiconductor device for the automated layout of the logic gates in the device, comprising:

a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate; and said route rule database that stores information regarding the gate types and gate sensitivities of said representative logic gates;

a block build tool that interconnects said logic gates with routes according to the route rules generated by said routing rule generation tool, said block build tool further comprises:

a gate sizing tool that sizes said logic gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

3. A method of building a software tool that generates wire route rules between logic gates in a semiconductor device for the automated layout of the logic gates in the device, comprising:

providing a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate; and said route rule database that stores information regarding the gate types and gate sensitivities of said representative logic gates;

providing a block build tool that interconnects said logic gates with routes according to the route rules generated by said routing rule generation tool, said block build tool further comprises:

a gate sizing tool that sizes said logic gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

4. A method of using a software tool that generates wire route rules between logic gates in a semiconductor device for the automated layout of the logic gates in the device, comprising:

creating a route rule database for a given semiconductor fabrication technology and circuit family of logic gates with a routing rule generation tool, said routing rule generation tool further comprises:

characterizing a suitable number of representative logic gates for noise sensitivity and determining the conditions under which an individual logic gate being characterized amplifies input noise with a certain gain with a noise sensitivity/gate characterization tool;

generating route rules that are derived using said representative logic gates using assumptions about internal charge sharing and supply voltage differences of said individual logic gate with a rule generator tool; and storing information regarding the gate types and gate sensitivities of said representative logic gates in said route rule database;

interconnecting said logic gates with routes according to the route rules generated by said routing rule generation tool with a block build tool, said block build tool further comprises:

sizing said logic gates using estimates for interconnect capacitance and resistance with a gate sizing tool;

comparing the noise sensitivity for various receiving logic gates with a gate analysis tool;

selecting a route rule according to the most noise sensitive logic gate receiving the route with a route rule selecting tool; and using a route assigning tool that performs the application of route rules to said logic gates in the semiconductor design.

5. A program storage device readable by a computer that tangibly embodies a program of instructions executable by the computer to perform a method of using a software tool that generates wire route rules between logic gates in a semiconductor device for the automated layout of the logic gates in the device, comprising:

creating a route rule database for a given semiconductor fabrication technology and circuit family of logic gates with a routing rule generation tool, said routing rule generation tool further comprises:

characterizing a suitable number of representative logic gates for noise sensitivity and determining the conditions under which an individual logic gate being characterized amplifies input noise with a certain gain with a noise sensitivity/gate characterization tool;

generating route rules that are derived using said representative logic gates using assumptions about internal charge sharing and supply voltage differences of said individual logic gate with a rule generator tool; and storing information regarding the gate types and gate sensitivities of said representative logic gates in said route rule database;

interconnecting said logic gates with routes according to the route rules generated by said routing rule generation tool with a block build tool, said block build tool further comprises:

sizing said logic gates using estimates for interconnect capacitance and resistance with a gate sizing tool;

comparing the noise sensitivity for various receiving logic gates with a gate analysis tool;

selecting a route rule according to the most noise sensitive logic gate receiving the route with a route rule selecting tool; and using a route assigning tool that performs the application of route rules to said logic gates in the semiconductor design.

6. A dependent claim according to claims 1, 2, 3, 4, or 5 wherein said block build tool interconnects said logic gates with routes so that said logic gates are immune to malfunction due to noise effects while retaining maximum circuit performance and minimizing the redesign of the semiconductor device due to discovery of noise problems.

7. A dependent claim according to claims 1, 2, 3, 4, or 5 wherein said rule generator tool uses an optimizing SPICE simulation for each sensing gate type, driving gate strength, sensing gate size, connecting route type, and charge sharing assumption to determine the required route length.

8. A software tool that generates wire route rules between logic gates in a semiconductor device for the automated layout of the logic gates in the device, comprising:

a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate, said rule generator tool uses an optimizing SPICE simulation for each sensing gate type, driving gate strength, sensing gate size, connecting route type, and charge sharing assumption to determine the required route length; and said route rule database that stores information regarding the gate types and gate sensitivities of said representative logic gates;

a block build tool that interconnects said logic gates with routes according to the route rules generated by said routing rule generation tool, said block build tool interconnects said logic gates with routes so that said logic gates are immune to malfunction due to noise effects while retaining maximum circuit performance and minimizing the redesign of the semiconductor device due to discovery of noise problems, said block build tool further comprises:

a gate sizing tool that sizes said individual gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

9. A system that generates wire route rules between logic gates in a semiconductor device for the automated layout of the logic gates in the device, comprising:

a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate, said rule generator tool uses an optimizing SPICE simulation for each sensing gate type, driving gate strength, sensing gate size, connecting route type, and charge sharing assumption to determine the required route length; and said route rule database that stores information regarding the gate types and gate sensitivities of said representative logic gates;

a block build tool that interconnects said logic gates with routes according to the route rules generated by said routing rule generation tool, said block build tool interconnects said logic gates with routes so that said logic gates are immune to malfunction due to noise effects while retaining maximum circuit performance and minimizing the redesign of the semiconductor device due to discovery of noise problems, said block build tool further comprises:

a gate sizing tool that sizes said logic gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

10. A method of building a software tool that generates wire route rules between logic gates in a semiconductor device for the automated layout of the logic gates in the device, comprising:

providing a routing rule generation tool that creates a route rule database for a given semiconductor fabrication technology and circuit family of logic gates, said routing rule generation tool further comprises:

a noise sensitivity/gate characterization tool that characterizes a suitable number of representative logic gates for noise sensitivity and determines the conditions under which an individual logic gate being characterized amplifies input noise with a certain gain;

a rule generator tool that generates route rules that are derived using said representative logic gates using assumptions about internal charge sharing and supply voltage differences of said individual logic gate, said rule generator tool uses an optimizing SPICE simulation for each sensing gate type, driving gate strength, sensing gate size, connecting route type, and charge sharing assumption to determine the required route length; and said route rule database that stores information regarding the gate types and gate sensitivities of said representative logic gates;

providing a block build tool that interconnects said logic gates with routes according to the route rules generated by said routing rule generation tool, said block build tool interconnects said logic gates with routes so that said logic gates are immune to malfunction due to noise effects while retaining maximum circuit performance and minimizing the redesign of the semiconductor device due to discovery of noise problems, said block build tool further comprises:

a gate sizing tool that sizes said logic gates using estimates for interconnect capacitance and resistance;

a gate analysis tool that compares the noise sensitivity for various receiving logic gates;

a route rule selecting tool that selects a route rule according to the most noise sensitive logic gate receiving the route; and a route assigning tool that performs the application of route rules to said logic gates in the semiconductor design.

11. A method of using a software tool that generates wire route rules between logic gates in a semiconductor device for the automated layout of the logic gates in the device, comprising:

creating a route rule database for a given semiconductor fabrication technology and circuit family of logic gates with a routing rule generation tool, said routing rule generation tool further comprises:

characterizing a suitable number of representative logic gates for noise sensitivity and determining the conditions under which an individual logic gate being characterized amplifies input noise with a certain gain with a noise sensitivity/gate characterization tool;

generating route rules that are derived using said representative logic gates using assumptions about internal charge sharing and supply voltage differences of said individual logic gate with a rule generator tool, said rule generator tool uses an optimizing SPICE simulation for each sensing gate type, driving gate strength, sensing gate size, connecting route type, and charge sharing assumption to determine the required route length; and storing information regarding the gate types and gate sensitivities of said representative logic gates in said route rule database;

interconnecting said logic gates with routes according to the route rules generated by said routing rule generation tool with a block build tool, said block build tool interconnects said logic gates with routes so that said logic gates are immune to malfunction due to noise effects while retaining maximum circuit performance and minimizing the redesign of the semiconductor device due to discovery of noise problems, said block build tool further comprises:

sizing said logic gates using estimates for interconnect capacitance and resistance with a gate sizing tool;

comparing the noise sensitivity for various receiving logic gates with a gate analysis tool;

selecting a route rule according to the most noise sensitive logic gate receiving the route with a route rule selecting tool; and using a route assigning tool that performs the application of route rules to said logic gates in the semiconductor design.

12. A program storage device readable by a computer that tangibly embodies a program of instructions executable by the computer to perform a method of using a software tool that generates wire route rules between logic gates in a semiconductor device for the automated layout of the logic gates in the device, comprising:

creating a route rule database for a given semiconductor fabrication technology and circuit family of logic gates with a routing rule generation tool, said routing rule generation tool further comprises:

characterizing a suitable number of representative logic gates for noise sensitivity and determining the conditions under which an individual logic gate being characterized amplifies input noise with a certain gain with a noise sensitivity/gate characterization tool;

generating route rules that are derived using said representative logic gates using assumptions about internal charge sharing and supply voltage differences of said individual logic gate with a rule generator tool, said rule generator tool uses an optimizing SPICE simulation for each sensing gate type, driving gate strength, sensing gate size, connecting route type, and charge sharing assumption to determine the required route length; and storing information regarding the gate types and gate sensitivities of said representative logic gates in said route rule database;

interconnecting said logic gates with routes according to the route rules generated by said routing rule generation tool with a block build tool, said block build tool interconnects said logic gates with routes so that said logic gates are immune to malfunction due to noise effects while retaining maximum circuit performance and minimizing the redesign of the semiconductor device due to discovery of noise problems, said block build tool further comprises:

sizing said logic gates using estimates for interconnect capacitance and resistance with a gate sizing tool;

comparing the noise sensitivity for various receiving logic gates with a gate analysis tool;

selecting a route rule according to the most noise sensitive logic gate receiving the route with a route rule selecting tool; and using a route assigning tool that performs the application of route rules to said logic gates in the semiconductor design.

* * * * *

UNITED STATES PATENT AND TRADEMARK OFFICE
CERTIFICATE OF CORRECTION

| | | |
|---|---|---|
| PATENT NO. | : 6,732,346 B2 | Page 1 of 1 |
| APPLICATION NO. | : 10/155042 | |
| DATED | : May 4, 2004 | |
| INVENTOR(S) | : Stephen C. Horne et al. | |

It is certified that error appears in the above-identified patent and that said Letters Patent is hereby corrected as shown below:

In column 5, line 32, delete "the this" and insert -- this --, therefor.

In column 9, line 65, after "twizzled" insert -- . --.

Signed and Sealed this

Eighth Day of November, 2011

David J. Kappos
*Director of the United States Patent and Trademark Office*